(12) United States Patent
Otsubo et al.

(10) Patent No.: US 9,443,778 B2
(45) Date of Patent: Sep. 13, 2016

(54) SEMICONDUCTOR DEVICE AND MANUFACTURING METHOD THEREOF

(71) Applicant: Mitsubishi Electric Corporation, Tokyo (JP)

(72) Inventors: Yoshitaka Otsubo, Tokyo (JP); Hiroshi Yoshida, Tokyo (JP); Junji Fujino, Tokyo (JP); Masao Kikuchi, Tokyo (JP); Junichi Murai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/717,309

(22) Filed: May 20, 2015

(65) Prior Publication Data

US 2016/0071778 A1 Mar. 10, 2016

(30) Foreign Application Priority Data

Sep. 10, 2014 (JP) ................................. 2014-183972

(51) Int. Cl.
*H01L 21/52* (2006.01)
*H01L 23/053* (2006.01)
(Continued)

(52) U.S. Cl.
CPC ............. *H01L 23/29* (2013.01); *H01L 21/486* (2013.01); *H01L 21/52* (2013.01); *H01L 21/54* (2013.01); *H01L 23/053* (2013.01); *H01L 23/13* (2013.01); *H01L 23/3178* (2013.01); *H01L 23/32* (2013.01); *H01L 23/3735* (2013.01); *H01L 23/4006* (2013.01); *H01L 23/49827* (2013.01); *H01L 24/29* (2013.01); *H01L 24/32* (2013.01); *H01L 24/73* (2013.01); *H01L 23/24* (2013.01); *H01L 2224/29111* (2013.01); *H01L 2224/32225* (2013.01); *H01L 2224/45014* (2013.01); *H01L 2224/45124* (2013.01);
(Continued)

(58) Field of Classification Search
CPC ... H01L 23/053; H01L 23/38; H01L 23/295; H01L 23/3171; H01L 23/5384; H01L 23/34; H01L 23/3675; H01L 2023/4031; H01L 23/3735; H01L 25/072; H01L 23/367; H01L 2224/16225; H01L 2924/3511; H01L 23/36; H01L 23/49844; H01L 2924/09701
See application file for complete search history.

(56) References Cited

U.S. PATENT DOCUMENTS 5,793,106 A 8/1998 Yasukawa et al.
2003/0094682 A1* 5/2003 Shinohara ............... H01L 23/13
257/685

FOREIGN PATENT DOCUMENTS

JP H08-236667 A 9/1996
JP 2000-200865 A 7/2000
(Continued)

*Primary Examiner* — Jasmine Clark
(74) *Attorney, Agent, or Firm* — Studebaker & Brackett PC (57) ABSTRACT

It is possible to provide a semiconductor device which can be obtained at a high reliability by warping an insulating substrate stably into a convex shape while ensuring a close contact between a cooling member and the insulating substrate. The semiconductor device includes an insulating substrate, a semiconductor element disposed on a first surface of the insulating substrate, a case connected to the insulating substrate, and a resin filled inside the case. Assuming that the thickness of the insulating substrate is denoted by t1, the thickness of the resin is denoted by t2, the linear expansion coefficient of the insulating substrate is denoted by α1, and the linear expansion coefficient of the resin is denoted by α2, the relationship therebetween satisfies t2≥t1 and α2≥α1, and a second surface of the insulating substrate opposite to the first surface thereof is warped into a convex shape.

8 Claims, 5 Drawing Sheets

(51) Int. Cl.
*H01L 23/498* (2006.01)
*H01L 23/31* (2006.01)
*H01L 23/32* (2006.01)
*H01L 23/29* (2006.01)
*H01L 21/48* (2006.01)
*H01L 21/54* (2006.01)
*H01L 23/40* (2006.01)
*H01L 23/00* (2006.01)
*H01L 23/13* (2006.01)
*H01L 23/373* (2006.01)
*H01L 23/24* (2006.01)

(52) U.S. Cl.
CPC ............... *H01L 2224/45147* (2013.01); *H01L 2224/48139* (2013.01); *H01L 2224/73265* (2013.01); *H01L 2924/1203* (2013.01); *H01L 2924/13055* (2013.01); *H01L 2924/181* (2013.01); *H01L 2924/19107* (2013.01); *H01L 2924/3511* (2013.01)

(56) References Cited

FOREIGN PATENT DOCUMENTS

| | | |
|---|---|---|
| JP | 2001-127238 A | 5/2001 |
| JP | 2002-315357 A | 10/2002 |
| JP | 2006-100640 A | 4/2006 |

\* cited by examiner

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and more specifically relates to a semiconductor device having an insulating substrate on which a semiconductor element is disposed connected to an external member and a manufacturing method thereof.

2. Description of the Background Art

Conventionally, it is known that a semiconductor device has been used in versatile aspects such as power generation, power transmission and efficient utilization and/or reproduction of energy. As such semiconductor device, there is one configured to have an insulating substrate, on which a semiconductor element is disposed, connected to a cooling member. Further, in such semiconductor device, a case is disposed so as to accommodate therein the semiconductor element, and the interior of the case may be filled with resin.

In order to improve the productivity and reliability of such semiconductor device, for example, a direct-potting seal technique by which an epoxy seal resin with a filler dispersed therein is injected into the case is gaining popularity. However, in such semiconductor device, how to ensure a close contact between the insulating substrate and the cooling member is an issue.

For example, Japanese Patent Laying-Open No. 2000-200865 discloses a method performed in such a manner that an insulating substrate is preliminarily warped downward into a convex shape, the semiconductor elements are installed on the insulating substrate to form a module, and the module is secured by screws to the cooling member with a sort of heat radiation grease uniformly spread between the insulating substrate and the cooling member so as to ensure the close contact.

Moreover, Japanese Patent Laying-Open No. 8-236667 discloses a method performed in such a manner that an inner portion of the insulating substrate, where the semiconductor elements are installed, positioned inner to an outer edge thereof is pressed downward so as to warp into a convex shape, and the warped insulating substrate is pressed against the cooling member so as to improve the close contact between the insulating substrate and the cooling member.

SUMMARY OF THE INVENTION

As a semiconductor device such as one provided with a power semiconductor element working under a high voltage and/or a large current, it is required that it has the functions to efficiently radiate to the outside the Joule heat generated due to the resistance of a junction and/or the heat generated due to conversion loss. In a cased semiconductor device (a sort of semiconductor device configured to have the semiconductor elements accommodated inside a case) commonly used in industrial applications such as transportation equipments and/or factory automation facilities, in order to transmit heat from a bottom surface of the insulating substrate to the cooling member, a sort of heat radiation grease is commonly used. Thus, how to spread the heat radiation grease sufficiently or how to suppress the occurrence of air bubbles (voids) caused by the air trapped into the heat radiation grease is important for efficient heat radiation in the long term. To this end, it is important to control the warpage of the insulating substrate or a heat sink exposed from the bottom surface of the semiconductor device, and it is also necessary to take into consideration the deformation of the case or the like occurred when securing the cooling member by screws.

Moreover, in order to seal and insulate the power semiconductor elements and wires inside the case for the purpose of improving the reliability, the direct-potting type seal resin has been applied in the manner as described above. The direct-potting type seal resin is a liquid resin that is obtained by dispersing a filler such as silica in an epoxy resin and the liquid resin is heated to cure after it is injected into the case. Using such a direct-potting type seal resin can free the necessity of a transfer mould, for example. However, since the direct-potting type seal resin has a higher elastic modulus in comparison with gel, it causes a larger deformation in the semiconductor device due to the curing shrinkage, and thus it is necessary to apply a new concept so as to control the amount of warpage of the insulating substrate described in the above.

In the technology disclosed in Japanese Patent Laying-Open No. 2000-200865, it is necessary to perform wire bonding for the purpose of die-bonding or wiring semiconductor elements such as a power semiconductor element to the warped insulating substrate. In this case, since it is difficult to stabilize the positioning and/or the joining conditions, it is believed that the workability such operation is inferior to the workability when a flat insulating substrate is used, and thereby it is considered as a major factor which reduces the yield and productivity and/or the reliability of products. Moreover, in securing the insulating substrate to the cooling member by screws, if the insulating substrate is secured to the cooling member by screws at the securing portion too tight, it is a possible that the insulating substrate will warp reversely and thereby trap air inside.

In the technology disclosed in Japanese Patent Laying-Open No. 8-236667, although the cancellation of the linear expansion difference between the insulating substrate and a metallic heat radiation member serving a base has been taken into consideration, the influence from the insulating seal resin has not been considered in particular. Therefore, it is difficult to warp the insulating substrate into a convex shape and keep the shape stable. In other words, it is difficult to reliably increase the close contact of the insulating substrate to the cooling member, and in addition the productivity and/or yield in the manufacturing process of a semiconductor device may be affected disadvantageously.

Therefore, an object of the present invention is provide a semiconductor device which can be obtained at a high reliability by warping an insulating substrate stably into a convex shape while ensuring a close contact between a cooling member and the insulating substrate, and a manufacturing method thereof.

The semiconductor device according to a first embodiment of the present invention includes an insulating substrate, a semiconductor element disposed on a first surface of the insulating substrate, a case connected to the insulating substrate and configured to accommodate therein the semiconductor element, and a resin filled inside the case so as to bury the semiconductor element. In the semiconductor device, assuming that the thickness of the insulating substrate is denoted by t1, the thickness of the resin is denoted by t2, the linear expansion coefficient of the insulating substrate is denoted by $\alpha 1$, and the linear expansion coefficient of the resin is denoted by $\alpha 2$, the relationship therebetween satisfies $t2 \geq t1$ and $\alpha 2 \geq \alpha 1$, and a second surface of the insulating substrate opposite to the first surface is warped into a convex shape.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described with reference to the accompanying drawings. Note that in the drawings below, the same or corresponding parts will be assigned with the same reference numerals and the description thereof will not be repeated.

First Embodiment

Figure 1:
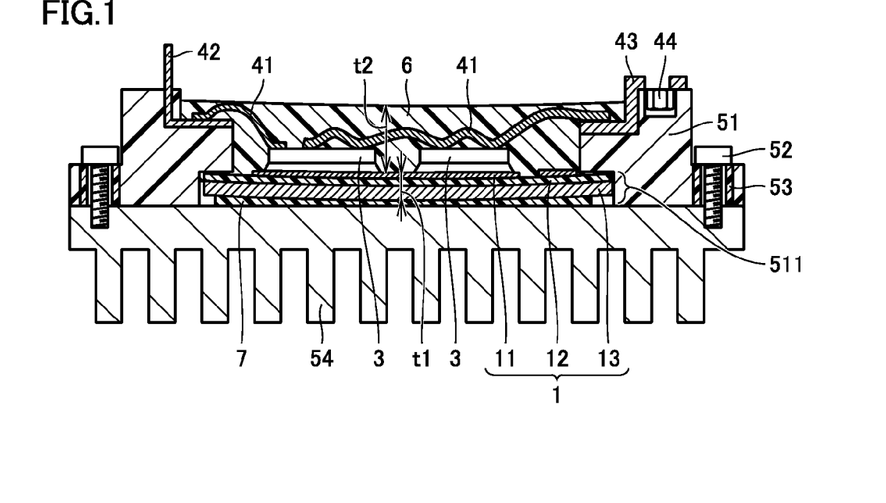
FIG. 1 is a schematic cross-sectional view illustrating a semiconductor device according to a first embodiment of the present invention.
Figure 2:
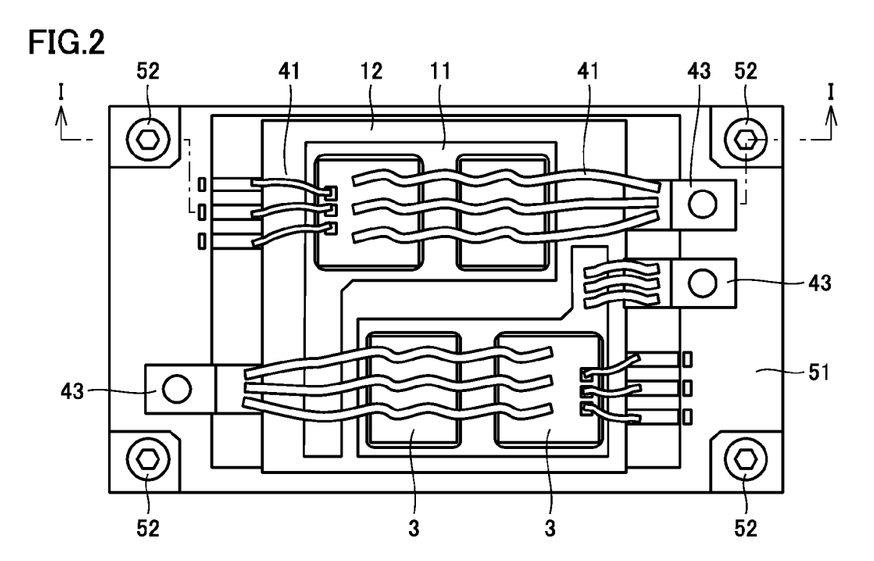
FIG. 2 is a top view of the semiconductor device illustrated in FIG. 1.

FIG. 1 is a schematic cross-sectional view illustrating a semiconductor device according to a first embodiment of the present invention. FIG. 2 is a top view of the semiconductor device illustrated in FIG. 1. For the sake of clarity in description, the direct-potting type seal resin (a sort of seal resin formed through direct potting may be simply referred to as a seal resin hereinafter where appropriate) is not illustrated in the drawings.

(Structure of Semiconductor Device)

With reference to FIGS. 1 and 2, a resin semiconductor device mainly includes an insulating substrate 1 (hereinafter referred to as substrate 1 where appropriate), a power semiconductor element 3 serving as a semiconductor element, a case 51, a direct-potting type seal resin 6 (hereinafter referred to as seal resin 6 where appropriate) serving as resin filled inside case 51. The semiconductor device further includes a screw 52 serving as a securing member for securing case 51 to a cooling device 54 serving as a cooling member which is an example of an external member located external to the semiconductor device. Assuming that the thickness of insulating substrate 1 is denoted by t1, the thickness of resin 6 is denoted by t2, the linear expansion coefficient of insulating substrate 1 is denoted by $\alpha1$, and the linear expansion coefficient of resin 6 is denoted by $\alpha2$, the relationship therebetween satisfying $t2 \geq t1$ and $\alpha2 \geq \alpha1$. A second surface of insulating substrate 1 opposite to a first surface thereof where power semiconductor element 3 is disposed is warped into a convex shape.

The dimensions of insulating substrate 1 are for example 70 mm in vertical direction×70 mm in horizontal direction×3 mm in thickness. Insulating substrate 1 has a multilayer structure in which an epoxy insulating layer 12 and a copper wiring 11 are formed on a copper base 13. The linear expansion coefficient of insulating substrate 1 of such a multilayer structure may be determined by prorating the linear expansion coefficients of materials of each layer in accordance with volume ratios or may be determined through experiments actually. Power semiconductor element 3 is disposed on one surface, namely a first surface of insulating substrate 1. As an example of power semiconductor element 3, an IGBT sized at 15 mm in vertical direction×15 mm in horizontal direction×0.3 mm in thickness or a diode sized at 12 mm in vertical direction×15 mm in horizontal direction×0.3 mm in thickness may be given.

Power semiconductor element 3 is die-bonded to copper wiring 11 on insulating substrate 1 by using a solder (for example, Sn—Ag—Cu solder having a melting point of 217° C.). Power semiconductor element 3 forms an electrical circuit between an external signal terminal 42 and an external main terminal 43 of case 51 through a wiring 41 (for example, an aluminum wire of ϕ0.4 mm at the side of the main circuit) which is formed by wire bonding. An opening is formed in external main terminal 43, and a nut 44 is disposed on the bottom of the opening. In the present embodiment, case 51 may be any case which is formed from resin into for example a rectangular shape in planar view, and specifically, formed from polyphenylene sulfide (PPS) into a frame body having a rectangular shape sized at 120 mm in vertical direction×80 mm in horizontal direction×20 mm in height. Case 51 is disposed so as to surround the outer periphery of insulating substrate 1. A sleeve portion 53 is formed on the outer periphery of case 51, protruding outward.

Direct-potting type seal resin 6 for sealing and insulating power semiconductor element 3 and wiring 41 is injected into a region surrounded by case 51 and insulating substrate 1 (a region inside case 51). Direct-potting type seal resin 6 may be obtained by dispersing a silica filler in epoxy resin. Sleeve portion 53 of case 51 is provided with a through hole for inserting therein a screw 52. Case 51 is secured to cooling device 54 by screw 52. Cooling device 54 may be any cooling device sized at for example 120 mm in vertical direction×80 mm in horizontal direction×20 mm in height and configured to include a flat upper surface in contact with insulating substrate 1 and a plurality of fins protruding from a lower surface in a direction away from the flat upper surface in contact with insulating substrate 1. As the material for cooling device 54, any materials can be used, and amongst aluminum is preferable (more specifically, it is casted from aluminum). Heat radiation grease 7 is supplied between insulating substrate 1 and cooling device 54. Heat radiation grease 7 may be obtained by for example dispersing a silica filler in silicone resin.

The second surface of insulating substrate 1 facing cooling device 54 is warped into a convex shape. A stepped portion 511 for supporting the outer edge of insulating substrate 1 is formed at a basal part of the inner periphery of case 51. While the outer edge is being pressed against cooling device 54 by stepped portion 511, the second surface of insulating substrate 1 is warped into a convex shape, enabling a close contact between insulating substrate 1 and cooling device 54.

(Manufacturing Method of Semiconductor Device)

Figure 3:
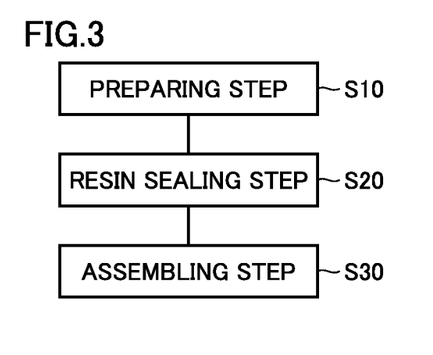
FIG. 3 is a flowchart illustrating a manufacturing method of the semiconductor device illustrated in FIG. 1.
Figure 4:
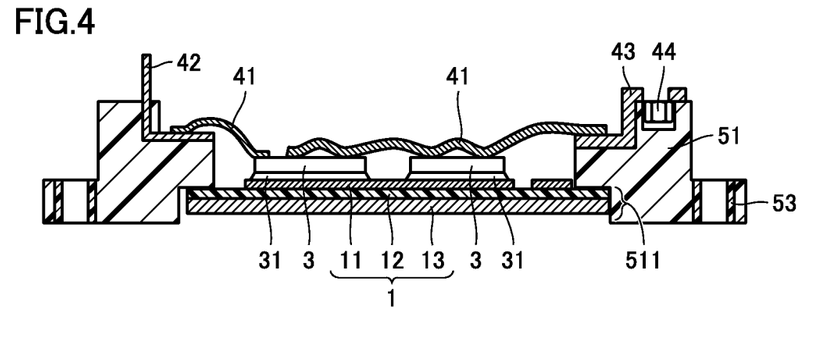
FIG. 4 is a schematic sectional view for explaining a manufacturing method of the semiconductor device illustrated in FIG. 3.
Figure 5:
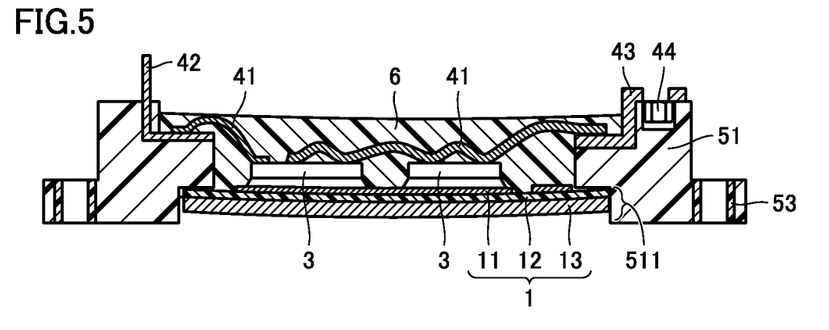
FIG. 5 is a schematic sectional view for explaining a manufacturing method of the semiconductor device illustrated in FIG. 3.
Figure 6:
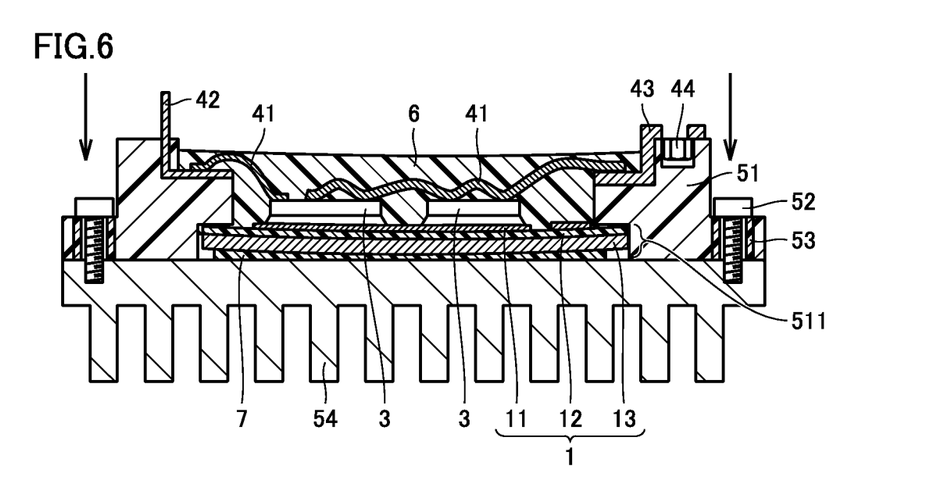
FIG. 6 is a schematic sectional view for explaining a manufacturing method of the semiconductor device illustrated in FIG. 3.

FIG. 3 is a flowchart illustrating a manufacturing method of the semiconductor device illustrated in FIGS. 1 and 2. FIGS. 4 to 6 are schematic cross-sectional views for explaining the manufacturing method illustrated in FIG. 3. Hereinafter, the manufacturing method of the semiconductor device will be described with reference to FIGS. 3 to 6.

Firstly, a preparing step (S10) illustrated in FIG. 3 is performed. Specifically, as illustrated in FIG. 4, power semiconductor element 3 is firstly disposed on copper wiring 11 of insulating substrate 1 with a solder 31 interposed therebetween, and they are heated so as to perform the die bonding. Thereafter, after case 51 is disposed so as to surround the outer periphery of insulating substrate 1, a main circuit and a signal circuit are formed respectively by die-bonding an aluminum wire serving as wiring 41. The insulating substrate at the present stage is substantially flat.

Next, a resin sealing step (S20) illustrated in FIG. 3 is performed. Specifically, as illustrated in FIG. 5, direct-potting type seal resin 6 is injected at room temperature into case 51. Then, a heating treatment is performed in an oven serving as a heating member at 150° C. for three hours so as to cure direct-potting type seal resin 6. During the heating treatment, due to the cure shrinkage of direct-potting type seal resin 6 (for example, shrink about 5% by volume) and a difference between the thermal expansion coefficient (linear expansion coefficient) of direct-potting type seal resin 6 and the thermal expansion coefficient (linear expansion coefficient) of insulating substrate 1, insulating substrate 1 warps downward convexly (for example at an amount of warpage of about 0.1 mm). In the present embodiment, the linear expansion coefficient of insulating substrate 1 may be for example 16 ppm/K, and the linear expansion coefficient of direct-potting type seal resin 6 may be for example 18 ppm/K.

Finally, an assembling step (S30) illustrated in FIG. 3 is performed. Specifically, as illustrated in FIG. 6, heat radiation grease 7 is applied to a central part of the flat upper surface of cooling device 54, and as indicated by an arrow, screw 52 is inserted into the through hole in sleeve portion 53 of case 51 to secure the case. In the present embodiment, the depth of stepped portion 511 for accommodating a part (the outer edge) of insulating substrate 1 in case 51 is set to be smaller than the sum (for example, 3.1 mm) of the thickness t1 of insulating substrate 1 (for example, 3 mm) and the amount of warpage of insulating substrate 1 (for example, 0.1 mm). Given as an example, the depth of stepped portion 511 may be set at 3.0 mm.

Since sleeve portion 53 is disposed outer than the outer periphery of insulating substrate 1, the outer periphery of insulating substrate 1 can be pressed against cooling side 54 by tightening screw 52. Therefore, it is possible to adjust the amount of warpage of insulating substrate 1 from 0.1 mm to nearly flat while keeping insulating substrate 1 to be warped convexly downward (to the side of cooling device 54). In this way, it is possible to obtain the semiconductor device illustrated in FIGS. 1 and 2.

Figure 7:
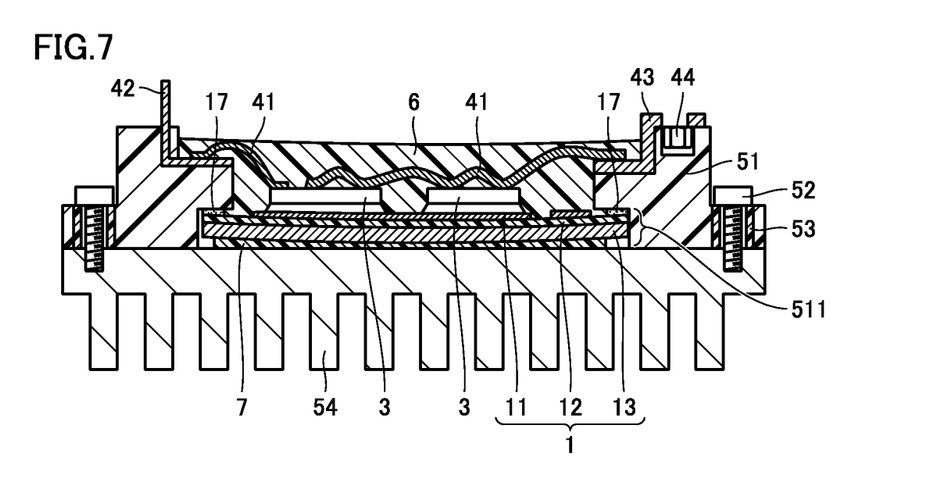
FIG. 7 is a schematic sectional view illustrating a modified example of the semiconductor device illustrated in FIG. 1.

FIG. 7 is a schematic sectional view illustrating a modified example of the semiconductor device illustrated in FIG. 1. As illustrated in FIG. 7, in order to prevent direct-potting type seal resin 6 from leaking, the application of an adhesive agent 17 to a contact portion between insulating substrate 1 and case 51 may be effective as well. With reference to FIG. 7, the semiconductor device is basically provided with the same structure as the semiconductor device illustrated in FIG. 1 but differs in that adhesive agent 17 is applied to the contact portion between case 51 and insulating substrate 1. Adhesive agent 17 is applied annularly along the outer edge of insulating substrate 1. The application of adhesive agent 17 assures that case 51 and the outer edge of insulating substrate 1 are connected to each other firmly while reducing the probability of seal resin 6 leaking from the connection portions between case 51 and insulating substrate 1 in the resin sealing step (S20) described in the above.

Direct-potting type seal resin 6 used in the present embodiment has a thermal expansion coefficient (linear expansion coefficient) larger than insulating substrate 1, in the case where the cure shrinkage is sufficiently large, direct-potting type seal resin 6 having a thermal expansion coefficient (linear expansion coefficient) equal to or much greater than insulating substrate 1 is effective as well.

Figure 8:
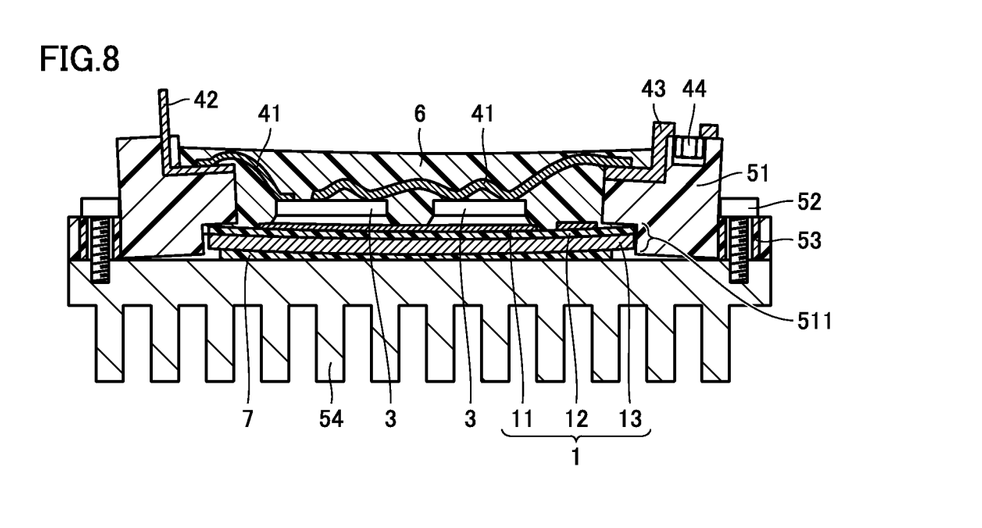
FIG. 8 is a schematic sectional view illustrating a modified example of the semiconductor device illustrated in FIG. 1.

FIG. 8 is a schematic sectional view illustrating a modified example of the semiconductor device illustrated in FIG. 1. With reference to FIG. 8, the semiconductor device is basically provided with the same structure as the semiconductor device illustrated in FIG. 1 but differs from the semiconductor device illustrated in FIG. 1 in that stepped portion 511 of case 51 has a different depth and in that case 51 is elastically deformed in the present embodiment. Specifically, stepped portion 511 of case 51 in the semiconductor device illustrated in FIG. 8 is configured to have a depth of 3.0 mm. Thereby, in the assembling step (S30), it is possible to restrain insulating substrate 1 by utilizing the elastic deformation of case 51 caused by tightening screw 52. In this way, it is possible to obtain the same effects as the semiconductor device illustrated in FIG. 1, and even if the amount of warpage of insulating substrate 1 varies slightly, it is still possible to firmly secure insulating substrate 1 by utilizing the elastic deformation.

Second Embodiment

Figure 9:
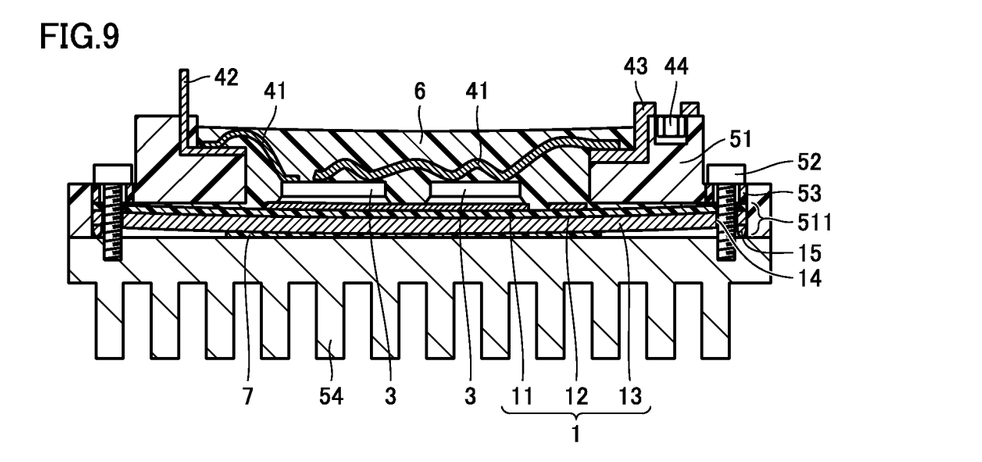
FIG. 9 is a schematic cross-sectional view illustrating a semiconductor device according to a second embodiment of the present invention.

FIG. 9 is a schematic cross-sectional view illustrating a semiconductor device according to a second embodiment of the present invention.

(Structure of Semiconductor Device)

The semiconductor device according to the second embodiment is basically provided with the same structure as the semiconductor device illustrated in FIG. 1 but differs from the semiconductor device illustrated in FIG. 1 in that the portion for securing case 51 and insulating substrate 1 via screw 52 is different in configuration. In other words, case 51 includes sleeve portion 53 serving as an overlapping portion that overlaps with the outer edge of insulating substrate 1 in planar view. The outer edge of insulating substrate 1 extends beneath sleeve portion 53. To describe in a different way, while stepped portion 511 in the semiconductor device of FIG. 1 is formed inner to the inner periphery of sleeve portion 53, stepped portion 511 in the semiconductor device illustrated in FIG. 9 is formed as a part of sleeve portion 53. A through hole is formed to penetrate sleeve portion 53 and the outer edge of insulating substrate 1. Screw 52 which serves as the securing member is inserted into the through hole and tightened so as to secure sleeve portion 53 and the outer edge of insulating substrate 1 to cooling device 54.

Insulating substrate 1 may be sized for example at 110 mm in vertical direction×70 mm in horizontal direction×3 mm in thickness. Similar to insulating substrate 1 illustrated in FIG. 1, insulating substrate 1 according to the second embodiment has a multilayer structure in which epoxy insulating layer 12 and copper wiring 11 are formed on copper base 13. Power semiconductor element 3 is disposed on one surface, namely a first surface of insulating substrate 1. As an example of power semiconductor element 3, it is possible to use the same device as power semiconductor element 3 in the first embodiment.

Similar to the semiconductor device illustrated in FIG. 1, power semiconductor element 3 is die-bonded on copper wiring 11 of insulating substrate 1 by soldering. Power semiconductor element 3 forms an electrical circuit between external signal terminal 42 and external main terminal 43 of case 51 through wiring 41 which is formed by wire bonding.

Similar to the semiconductor device illustrated in FIG. 1, direct-potting type seal resin 6 for sealing and insulating power semiconductor element 3 and wiring 41 is injected into a region surrounded by case 51 and insulating substrate 1 (a region inside case 51). Sleeve portion 53 of case 51 is provided with a through hole for inserting therein screw 52. At a position corresponding to the through hole, a through hole 14 is formed in insulating substrate 1. Case 51 and insulating substrate 1 are secured to cooling device 54 by screw 52. The shape and the material of cooling device 54 may be the same as that of cooling device 54 illustrated in FIG. 1. Heat radiation grease 7 is supplied between insulating substrate 1 and cooling device 54. Similar to that in the semiconductor device illustrated in FIG. 1, heat radiation grease 7, for example, may be obtained by dispersing a silica filler in silicone resin.

The second surface of insulating substrate 1 facing cooling device 54 is warped into a convex shape. Stepped portion 511 for supporting the outer edge of insulating substrate 1 is formed at a basal part of sleeve portion 53 positioned at the inner periphery of case 51. While the outer edge is being pressed against cooling device 54 by stepped portion 511, the second surface of insulating substrate 1 is warped into a convex shape, enabling a close contact between insulating substrate 1 and cooling device 54.

The depth of stepped portion 511 for accommodating the outer edge of insulating substrate 1 in case 51 is set to be smaller than the sum (for example, 3.1 mm) of the thickness t1 of insulating substrate 1 (for example, 3 mm) and the amount of warpage of insulating substrate 1 (for example, 0.1 mm). Given as an example, in the present embodiment, the depth of stepped portion 511 may be set at 3.0 mm. In this way, it is possible to adjust the amount of warpage of insulating substrate 1 from 0.1 mm substantially to zero (nearly flat) while keeping insulating substrate 1 to be warped convexly downward (to the side of cooling device 54).

The semiconductor device illustrated in FIG. 9 can obtain the same effects as the semiconductor device illustrated in FIG. 1, and by fastening the entire case 51 via a screw inserted into through hole 14 of insulating substrate 1, it is possible to secure insulating substrate 1 firmly not only in the thickness direction but also in the vertical and horizontal directions.

In addition, a projection 15 (for example, 0.1 mm in height) is formed on the surface of insulating substrate 1 in contact with cooling device 54 at a position outer than through hole 14. The formation of projection 15 prevents the portion of insulating substrate 1 around the screw from being warped reversely due to the close contact with cooling device 54 (i.e., being warped opposite to the direction where the central portion of insulating substrate 1 is warped into a convex shape toward power semiconductor element 3).

(Manufacturing Method of Semiconductor Device)

Although the size and/or the shape of insulating substrate 1 and case 51 to be prepared are different from those prepared for the semiconductor device illustrated in FIG. 1, the manufacturing method of the semiconductor device illustrated in FIG. 9 is basically the same as the manufacturing method of the semiconductor device illustrated in FIG. 1.

Although insulating substrate 1 in each of the embodiments described above, includes copper base 13, the same effect can be obtained as long as insulating substrate 1 includes a metal plate superior in heat radiation such as aluminum as the base. In addition, the same effect can be obtained when a ceramic substrate including a base made of materials such as alumina, aluminum nitride or silicon nitride is used as insulating substrate 1. In the case where power semiconductor element 3 to be used radiates a small amount of heat, the same effect can be obtained as well when an epoxy glass substrate is used as insulating substrate 1. Furthermore, the same effect can be obtained by attaching any of these insulating substrates 1 to a heat sink made of copper or aluminum.

Although in each of the embodiments described above, an aluminum wire bonding is used as wiring 41, the same effect can be obtained by using a copper wire bonding or an aluminum ribbon bonding as wire 41. In addition, the same effect can be obtained by soldering or joining through ultrasonic waves a bus bar-shaped terminal formed by extending the external terminal of case 51 onto the surface of power semiconductor element 3 to power semiconductor element 3.

Although in each of the embodiments described above, a case made of polyphenylene sulfide (PPS) is used as case 51, the same effect can be obtained when case 51 is made of a resin material or a liquid crystal polymer superior in heat resistance such as polybutylene terephthalate (PBT), nylon 6 (PA 6), polyethylene terephthalate (PET), or a mixture of PET and PBT. Further, external main terminal 43 is configured as a terminal secured by nut 44 which is disposed at a lower part of the external main terminal, and another terminal configured in an alternate manner is applicable. For example, the same effect can be obtained when a straight terminal welded directly to a cable is used as external main terminal 43.

Although in each of the embodiments described above, heat radiation grease 7 in liquid is applied through coating to the central part of cooling device 54, heat radiation grease 7 may be supplied to a desired position by any other approach. For example, the same effect can be obtained by supplying heat radiation grease 7 to cooling device 54 through printing or via a dispenser in a desired pattern. Furthermore, the same effect can be obtained as well through such a process that a plate-shaped heat radiation sheet, which thermally softens when subject to heating, is disposed between cooling device 54 and insulating substrate 1, and a thermal softening treatment is performed thereafter.

Figure 10:
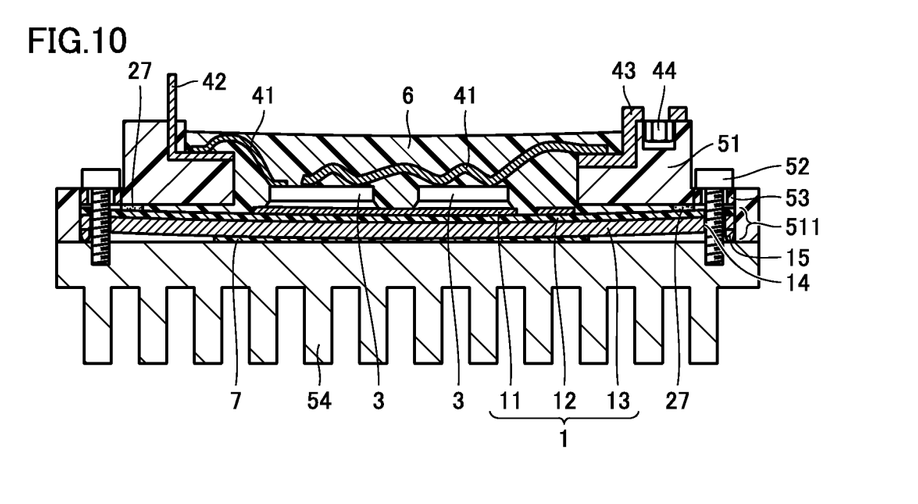
FIG. 10 is a schematic cross-sectional view illustrating a modified example of the semiconductor device illustrated in FIG. 9.

FIG. 10 is a schematic sectional view illustrating a modified example of the semiconductor device illustrated in FIG. 9. As illustrated in FIG. 10, in order to prevent direct-potting type seal resin 6 from leaking, the application of an adhesive agent 27 to a contact portion between insulating substrate 1 and case 51 may be effective as well. With reference to FIG. 10, the semiconductor device is basically provided with the same structure as the semiconductor device illustrated in FIG. 9 but differs in that adhesive agent 27 is applied to the contact portion between case 51 and insulating substrate 1. Adhesive agent 27 is applied annularly along the outer edge of insulating substrate 1 inner than through hole 14 provided in insulating substrate 1. The application of adhesive agent 27 assures that case 51 and the outer edge of insulating substrate 1 are connected to each other firmly while reducing the probability of seal resin 6 leaking from the connection portions between case 51 and insulating substrate 1 in the resin sealing step (S20) described in the above.

Direct-potting type seal resin 6 used in the present embodiment has a thermal expansion coefficient (linear expansion coefficient) larger than insulating substrate 1, in the case where the cure shrinkage is sufficiently large, direct-potting type seal resin 6 having a thermal expansion coefficient (linear expansion coefficient) equal to or much greater than insulating substrate 1 is effective as well.

Hereinafter, the characteristic features of the present invention will be described and some may duplicate with those described in the abovementioned embodiments.

The semiconductor device according to the first embodiment of the present invention includes insulating substrate 1, a semiconductor element (power semiconductor element 3) disposed on a first surface of insulating substrate 1, case 51 connected to insulating substrate 1 and configured to accommodate therein the semiconductor element, and a resin (direct-potting type seal resin 6) filled inside case 51 so as to bury the semiconductor element. In the semiconductor device, assuming that the thickness of insulating substrate 1 is denoted by t1, the thickness of the resin (direct-potting type seal resin 6) is denoted by t2, the linear expansion coefficient of insulating substrate 1 is denoted by $\alpha 1$, and the linear expansion coefficient of the resin is denoted by $\alpha 2$, the relationship therebetween satisfies $t2 \geq t1$ and $\alpha 2 \geq \alpha 1$, and a second surface of insulating substrate 1 is warped into a convex shape.

Accordingly, due to the difference between the linear expansion coefficient of direct-potting type seal resin 6 to be filled for the sealing purpose and the linear expansion coefficient of insulating substrate 1, it is possible to perform a process to solidify the resin filled inside case 51 so as to warp the second surface of insulating substrate 1 into a convex shape. Thus, prior to the step of filling the resin, it is possible to keep insulating substrate 1 flat. Therefore, the wire bonding for bonding or wiring power semiconductor element 3 to insulating substrate 1 can be performed on the flat insulating substrate 1 prior to the step of filling the resin. Thereby, it is possible to improve the efficiency of operations such as bonding the semiconductor element and reduce the probability of occurrence of defective products, and as a result, it is possible to obtain semiconductor devices at a high reliability.

Further, since the second surface of the insulating substrate is warped into the convex shape by the filling and solidification of the resin, when connecting for example a cooling member (cooling device 54) to the second surface of insulating substrate 1 opposite to the first surface thereof, it is possible to prevent voids from being generated between the cooling member and the second surface of the insulating substrate (for example, a central portion of the second surface).

Furthermore, it is possible to control the linear expansion coefficient and thickness of both the resin and the insulating substrate, which makes it possible to control both the warping direction and the amount of warpage of the insulating substrate with a perfect reproducibility.

As illustrated in FIG. 1, in the semiconductor device described above, case 51 may be provided with an overlapping portion (the portion in case 51 of FIG. 1 where stepped portion 511 is formed) that overlaps with the outer edge of insulating substrate 1 in planar view and an extending portion (sleeve portion 53) that extends from the overlapping portion outward than the outer edge of insulating substrate 1. The semiconductor device may further include a securing member (screw 52) configured to secure the extending portion of case 51 to a cooling member (cooling device 54) serving as an external member located external to the semiconductor device. Stepped portion 511 may be formed in the overlapping portion so as to accommodate the outer edge of insulating substrate 1. The depth of stepped portion 511 may be set smaller than the sum of the thickness t1 of insulating substrate 1 and the amount of warpage of insulating substrate 1 in a state where the outer edge of insulating substrate 1 has not yet been pressed by stepped portion 511 of case 51.

Accordingly, since the outer edge of insulating substrate 1 is pressed by stepped portion 511 of case 51, insulating substrate 1 can be held securely by stepped portion 511 with the amount of warpage of insulating substrate 1 being controlled accurately at the same time.

As illustrated in FIG. 8, in the semiconductor device described above, case 51 may be elastically deformed when it is secured to the external member (cooling device 54) by using a securing member (screw 52) in a state where the outer edge of insulating substrate 1 is sandwiched between the overlapping portion and the external member.

Accordingly, even if the amount of warpage of insulating substrate 1 before the outer edge of insulating substrate 1 is pressed by case 51 is greater, the greater amount of warpage of insulating substrate 1 can be cancelled due to the elastic deformation of case 51, making it possible to tightly secure insulating substrate 1 to the external member (cooling device 54).

As illustrated in FIG. 9, in the semiconductor device described above, case 51 may be provided with an overlapping portion (the portion where stepped portion 511 is formed as illustrated in FIG. 9) that overlaps with the outer edge of insulating substrate 1 in planar view. A through hole (the through hole in case 51 and through hole 14 in insulating substrate 1 as illustrated in FIG. 9) may be formed to penetrate the overlapping portion of case 51 and the outer edge of insulating substrate 1. The semiconductor device may further include a securing member (screw 52) inserted into the through hole so as to secure the outer edge of insulating substrate 1 and the overlapping portion to an external member (cooling device 54) located external to the semiconductor device.

Accordingly, insulating substrate 1 can be tightly secured to the external member (cooling device 54) together with case 51 by the securing member (screw 52).

The manufacturing method of a semiconductor device according to one embodiment of the present invention includes a step (the preparing step (S10)) of disposing a semiconductor element (power semiconductor element 3) on a first surface of insulating substrate 1 and preparing case 51 connected to insulating substrate 1 and configured to accommodate therein the semiconductor element, and a step (the resin sealing step (S20)) of filling a resin (direct-potting type seal resin 6) into case 51 so as to bury therein the semiconductor element (power semiconductor element 3). Assuming that the thickness of insulating substrate 1 is denoted by t1, the thickness of the resin is denoted by t2, the linear expansion coefficient of insulating substrate 1 is denoted by α1, and the linear expansion coefficient of the resin is denoted by α2, the relationship therebetween satisfies t2≥t1 and α2≥α1, and after the step (S20) of filling the resin, a second surface of insulating substrate 1 opposite to the first surface thereof is warped into a convex shape. Additionally, in the preparing step (S10), insulating substrate 1 is preferred to have a smaller amount of warpage (preferably have a flat shape) than the amount of warpage after the step of filling the resin.

Accordingly, due to the difference between the linear expansion coefficient of the resin (direct-potting type seal resin 6) to be filled for the sealing purpose and the linear expansion coefficient of insulating substrate 1, it is possible to perform the step of filling the resin into case 51 (S20) so as to warp the second surface of insulating substrate 1 into a convex shape. Thus, in the preparing step (S10) prior to the step of filling the resin, it is possible to keep insulating substrate 1 flat. Therefore, all operations (including the wire bonding operation for bonding or wiring power semiconductor element 3 to insulating substrate 1 and the like) in the preparing step (S10) can be performed on the flat insulating substrate 1. Thereby, it is possible to improve the efficiency of operations in the preparing step (S10) and reduce the probability of occurrence of defective products, and as a result, it is possible to obtain semiconductor devices at a high reliability.

Further, since the second surface of insulating substrate 1 is warped by the step of filling the resin (S20) into a convex shape, it is possible to prevent voids from being generated between the cooling member (cooling device 54) and the second surface of insulating substrate 1 (for example, a central portion of the second surface).

Furthermore, it is possible to control the linear expansion coefficient and thickness of both the resin and insulating substrate 1, which makes it possible to control both the warping direction and the amount of warpage of insulating substrate 1 with a perfect reproducibility.

The manufacturing method of the semiconductor device may further include a step (the assembling step (S30)) of connecting the second surface of insulating substrate 1 opposite to the first surface thereof to an external member (cooling device 54 serving as an example of cooling member) located external to the semiconductor device after the step (S20) of filling the resin. In the manufacturing method of the semiconductor device, case 51 in the preparing step (S10) may be provided with an overlapping portion (the portion illustrated in FIG. 1 where stepped portion 511 is formed) that overlaps with the outer edge of insulating substrate 1 in planar view and an extending portion (sleeve portion 53) that extends from the overlapping portion outward than the outer edge of insulating substrate 1. Stepped portion 511 may be provided in the overlapping portion so as to accommodate the outer edge of insulating substrate 1. The depth of stepped portion 511 may be set smaller than the sum of the thickness t1 of insulating substrate 1 and the amount of warpage of insulating substrate 1 in a state where the outer edge of insulating substrate 1 has not yet been pressed by stepped portion 511 of case 51. In the connecting step (S30), the extending portion of case 51 may be secured to the external member (cooling device 54) by using a securing member (screw 52).

Accordingly, in the connecting step (S30), since the outer edge of insulating substrate 1 is pressed by stepped portion 511 of case 51, insulating substrate 1 can be held securely by stepped portion 511 with the amount of warpage of insulating substrate 1 being controlled accurately at the same time.

In the manufacturing method of the semiconductor device, case 51 in the connecting step (S30) may be elastically deformed when it is secured to the external member (cooling device 54) by using the securing member (screw 52) in a state where the outer edge of insulating substrate 1 is sandwiched between the overlapping portion and the external member (cooling device 54).

Accordingly, even if the amount of warpage of insulating substrate 1 becomes greater in the step of filling the resin (S20), the greater amount of warpage of insulating substrate 1 can be cancelled due to the elastic deformation of case 51, making it possible to tightly secure insulating substrate 1 to the external member.

The manufacturing method of the semiconductor device may further include a step (assembling step (S30)) of connecting the second surface of insulating substrate 1 opposite to the first surface thereof to an external member (cooling device 54 serving as an example of cooling member) located external to the semiconductor device after the step (S20) of filling the resin. In the manufacturing method of the semiconductor device, case 51 in the preparing step (S10) may be provided with an overlapping portion (the portion as illustrated in FIG. 9 where stepped portion 511 is formed) that overlaps with the outer edge of insulating substrate 1 in planar view. A through hole (the through hole in case 51 and through hole 14 in insulating substrate 1 as illustrated in FIG. 9) may be formed to penetrate the overlapping portion of case 51 and the outer edge of insulating substrate 1. In the connecting step (S30), the securing member (screw 52) may be inserted into the through hole so as to secure the overlapping portion and the outer edge of insulating substrate to the external member.

Accordingly, insulating substrate 1 can be tightly secured to the external member (cooling device 54) together with case 51 by the securing member (screw 52) in the connecting step (S30).

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
   an insulating substrate;
   a semiconductor element disposed on a first surface of said insulating substrate;
   a case connected to said insulating substrate and configured to accommodate therein said semiconductor element; and
   a resin filled inside said case so as to bury said semiconductor element,
   assuming that the thickness of said insulating substrate is denoted by t1, the thickness of said resin is denoted by t2, the linear expansion coefficient of said insulating substrate is denoted by $\alpha 1$, and the linear expansion coefficient of said resin is denoted by $\alpha 2$, the relationship therebetween satisfying t2≥t1 and $\alpha 2 \geq \alpha 1$, and
   a second surface of said insulating substrate opposite to said first surface thereof being warped into a convex shape.

2. The semiconductor device according to claim 1, wherein
   said case is provided with an overlapping portion that overlaps with an outer edge of said insulating substrate in planar view, and an extending portion that extends from said overlapping portion outward than said outer edge of said insulating substrate, said semiconductor device further includes a securing member configured to secure said extending portion of said case to an external member located external to said semiconductor device, said overlapping portion is provided with a stepped portion so as to accommodate said outer edge of said insulating substrate, and the depth of said stepped portion is smaller than the sum of the thickness of said insulating substrate and an amount of warpage of said insulating substrate in a state where said outer edge of said insulating substrate has not yet been pressed by said stepped portion of said case.

3. The semiconductor device according to claim 2, wherein said case is elastically deformed when it is secured to said external member by using said securing member in a state where said outer edge of said insulating substrate is sandwiched between said overlapping portion and said external member.

4. The semiconductor device according to claim 1, wherein said case is provided with an overlapping portion that overlaps with an outer edge of said insulating substrate in planar view, a through hole is formed to penetrate said overlapping portion of said case and said outer edge of said insulating substrate, and said semiconductor device further includes a securing member inserted into said through hole so as to secure said outer edge of said insulating substrate and said overlapping portion to an external member located external to said semiconductor device.

5. A manufacturing method of a semiconductor device, comprising:

a step of disposing a semiconductor element on a first surface of an insulating substrate and preparing a case connected to said insulating substrate and configured to accommodate therein said semiconductor element; and a step of filling a resin into said case so as to bury therein said semiconductor element, assuming that the thickness of said insulating substrate is denoted by t1, the thickness of said resin is denoted by t2, the linear expansion coefficient of said insulating substrate is denoted by α1, and the linear expansion coefficient of said resin is denoted by α2, the relationship therebetween satisfying t2≥t1 and α2≥α1, and after the step of filling said resin, a second surface of said insulating substrate opposite to said first surface thereof being warped into a convex shape.

6. The manufacturing method of a semiconductor device according to claim 5 further comprising:

a step of connecting said second surface of said insulating substrate opposite to said first surface thereof to an external member located external to said semiconductor device after the step of filling said resin, wherein in the preparing step, said case is provided with an overlapping portion that overlaps with an outer edge of said insulating substrate in planar view and an extending portion that extends from said overlapping portion outward than said outer edge of said insulating substrate, said overlapping portion is provided with a stepped portion so as to accommodate said outer edge of said insulating substrate, and the depth of said stepped portion is smaller than the sum of the thickness of said insulating substrate and an amount of warpage of said insulating substrate in a state where said outer edge of said insulating substrate has not yet been pressed by said stepped portion of said case, and in the connecting step, said extending portion of said case is secured to said external member by using a securing member.

7. The manufacturing method of a semiconductor device according to claim 6, wherein in the connecting step, said case is elastically deformed when it is secured to said external member by using said securing member in a state where said outer edge of said insulating substrate is sandwiched between said overlapping portion and said external member.

8. The manufacturing method of a semiconductor device according to claim 5 further comprising:

a step of connecting said second surface of said insulating substrate opposite to said first surface thereof to an external member located external to said semiconductor device after the step of filling said resin, wherein in the preparing step, said case is provided with an overlapping portion that overlaps with an outer edge of said insulating substrate in planar view, and a through hole is formed to penetrate said overlapping portion of said case and said outer edge of said insulating substrate, in the connecting step, said securing member is inserted into said through hole so as to secure said outer edge of said insulating substrate and said overlapping portion to said external member.

\* \* \* \* \*